US007917885B2

(12) United States Patent
Becker

(10) Patent No.: US 7,917,885 B2
(45) Date of Patent: *Mar. 29, 2011

(54) METHODS FOR CREATING PRIMITIVE CONSTRUCTED STANDARD CELLS

(75) Inventor: Scott T. Becker, Darien, IL (US)

(73) Assignee: Tela Innovations, Inc., Los Gatos, CA (US)

( * ) Notice: Subject to any disclaimer, the term of this patent is extended or adjusted under 35 U.S.C. 154(b) by 394 days.

This patent is subject to a terminal disclaimer.

(21) Appl. No.: 12/021,722

(22) Filed: Jan. 29, 2008

(65) Prior Publication Data

US 2008/0120588 A1     May 22, 2008

Related U.S. Application Data

(63) Continuation of application No. 11/169,188, filed on Jun. 27, 2005, now Pat. No. 7,343,581.

(51) Int. Cl.
G06F 17/50 (2006.01)
G06F 9/45 (2006.01)
(52) U.S. Cl. ......... 716/137; 716/103; 716/118; 716/119
(58) Field of Classification Search .............. 716/17–18, 716/103, 118–119, 137
See application file for complete search history.

(56) References Cited

U.S. PATENT DOCUMENTS

| 4,197,555 A | 4/1980 | Uehara et al. ................... 357/70 |
| 5,378,649 A | 1/1995 | Huang ............................. 437/52 |
| 5,581,098 A | 12/1996 | Chang ........................... 257/211 |
| 5,682,323 A | 10/1997 | Pasch et al. ................... 364/491 |
| 5,684,733 A | 11/1997 | Wu et al. ........................ 365/100 |
| 5,825,203 A | 10/1998 | Kusunoki et al. ............... 326/41 |
| 5,841,663 A * | 11/1998 | Sharma et al. .................. 716/18 |
| 5,847,421 A | 12/1998 | Yamaguchi ..................... 257/207 |
| 5,898,194 A | 4/1999 | Gheewala ....................... 257/206 |
| 5,908,827 A | 6/1999 | Sirna ............................... 514/12 |
| 5,923,059 A | 7/1999 | Gheewala ....................... 257/204 |
| 5,935,763 A | 8/1999 | Caterer et al. ................. 430/313 |

(Continued)

FOREIGN PATENT DOCUMENTS

JP    H06-188312    7/1994

(Continued)

OTHER PUBLICATIONS

Koorapaty et al., "Exploring Logic Block Granularity for Regular Fabrics", 2004, IEEE.

(Continued)

*Primary Examiner* — Stacy A Whitmore
(74) *Attorney, Agent, or Firm* — Martine Penilla & Gencarella, LLP

(57) ABSTRACT

A high-level logic description is developed based on a non-primitive-based standard cell library. The logic description is synthesized into a netlist that includes references to the non-primitive-based standard cell library. A logic function for each standard cell in the netlist is determined and mapped into a set of primitive logic cells to create a primitive constructed version of each referenced standard cell. The set of primitive logic cells is defined for integration within a base array. The primitive constructed version of each referenced standard cell is included within a primitive-based cell library. The primitive-based cell library is used to place and route the netlist for the logic design for integration within the base array. The logic design is then integrated within the base array.

27 Claims, 9 Drawing Sheets

U.S. PATENT DOCUMENTS

| | | | | |
|---|---|---|---|---|
| 5,977,305 | A | 11/1999 | Wigler et al. | 530/350 |
| 6,100,025 | A | 8/2000 | Wigler et al. | 435/6 |
| 6,174,742 | B1 | 1/2001 | Sudhindranath et al. | 438/14 |
| 6,182,272 | B1 | 1/2001 | Andreev et al. | 716/13 |
| 6,194,252 | B1 | 2/2001 | Yamaguchi | 438/129 |
| 6,194,912 | B1 | 2/2001 | Or-Bach | 326/38 |
| 6,240,542 | B1 | 5/2001 | Kapur | 716/12 |
| 6,255,600 | B1 | 7/2001 | Schaper | 174/255 |
| 6,260,177 | B1 | 7/2001 | Lee et al. | 716/2 |
| 6,275,973 | B1 | 8/2001 | Wein | 716/10 |
| 6,331,733 | B1 | 12/2001 | Or-Bach et al. | 257/758 |
| 6,338,972 | B1 | 1/2002 | Sudhindranath et al. | 438/14 |
| 6,416,907 | B1 | 7/2002 | Winder et al. | 430/5 |
| 6,425,117 | B1 | 7/2002 | Pasch et al. | 716/21 |
| 6,476,493 | B2 | 11/2002 | Or-Bach et al. | 257/758 |
| 6,480,989 | B2 | 11/2002 | Chan et al. | 716/8 |
| 6,505,327 | B2 | 1/2003 | Lin | 716/5 |
| 6,525,350 | B1 | 2/2003 | Kinoshita et al. | 257/202 |
| 6,571,140 | B1 | 5/2003 | Wewalaarachchi | 700/83 |
| 6,574,786 | B1 | 6/2003 | Pohlenz et al. | 716/17 |
| 6,590,289 | B2 | 7/2003 | Shively | 257/758 |
| 6,591,207 | B2 | 7/2003 | Naya et al. | 702/81 |
| 6,620,561 | B2 | 9/2003 | Winder et al. | 430/5 |
| 6,661,041 | B2 | 12/2003 | Keeth | 257/211 |
| 6,691,297 | B1 | 2/2004 | Misaka et al. | 716/21 |
| 6,714,903 | B1 | 3/2004 | Chu et al. | 703/19 |
| 6,737,199 | B1 | 5/2004 | Hsieh | 430/5 |
| 6,745,372 | B2 | 6/2004 | Cote et al. | 716/2 |
| 6,792,593 | B2 | 9/2004 | Takashima et al. | 716/21 |
| 6,795,952 | B1 | 9/2004 | Stine et al. | 716/5 |
| 6,807,663 | B2 | 10/2004 | Cote et al. | 716/21 |
| 6,819,136 | B2 | 11/2004 | Or-Bach | 326/41 |
| 6,834,375 | B1 | 12/2004 | Stine et al. | 716/2 |
| 6,850,854 | B2 | 2/2005 | Naya et al. | 702/81 |
| 6,854,100 | B1 | 2/2005 | Chuang et al. | 716/5 |
| 6,877,144 | B1 | 4/2005 | Rittman et al. | 716/10 |
| 6,884,712 | B2 | 4/2005 | Yelehanka et al. | 438/622 |
| 6,904,582 | B1 | 6/2005 | Rittman et al. | 716/10 |
| 6,928,635 | B2 | 8/2005 | Pramanik et al. | 716/21 |
| 6,931,617 | B2 | 8/2005 | Sanie et al. | 716/18 |
| 6,953,956 | B2 | 10/2005 | Or-Bach et al. | 257/203 |
| 6,978,437 | B1 | 12/2005 | Rittman et al. | 716/21 |
| 6,992,925 | B2 | 1/2006 | Peng | 365/177 |
| 7,028,285 | B2 | 4/2006 | Cote et al. | 716/21 |
| 7,041,568 | B2 | 5/2006 | Goldbach et al. | 438/387 |
| 7,064,068 | B2 | 6/2006 | Chou et al. | 438/687 |
| 7,093,228 | B2 | 8/2006 | Andreev et al. | 716/21 |
| 7,103,870 | B2 | 9/2006 | Misaka et al. | 716/21 |
| 7,120,882 | B2 | 10/2006 | Kotani et al. | 716/5 |
| 7,137,092 | B2 | 11/2006 | Maeda | 716/8 |
| 7,149,999 | B2 | 12/2006 | Kahng et al. | 716/19 |
| 7,155,689 | B2 | 12/2006 | Pierrat | 716/4 |
| 7,278,118 | B2 | 10/2007 | Pileggi et al. | 716/1 |
| 7,343,581 | B2 * | 3/2008 | Becker | 716/14 |
| 2004/0145028 | A1 | 7/2004 | Matsumoto et al. | 257/620 |
| 2004/0161878 | A1 | 8/2004 | Or-Bach et al. | 438/113 |
| 2004/0243966 | A1 | 12/2004 | Dellinger | 716/17 |
| 2005/0055828 | A1 | 3/2005 | Wang et al. | 29/857 |
| 2005/0101112 | A1 | 5/2005 | Rueckes et al. | 438/584 |
| 2005/0189614 | A1 | 9/2005 | Ihme et al. | 257/532 |
| 2005/0224982 | A1 | 10/2005 | Kemerling et al. | 257/758 |
| 2006/0121715 | A1 | 6/2006 | Chang et al. | |
| 2006/0151810 | A1 | 7/2006 | Ohshige | 257/207 |
| 2006/0223302 | A1 | 10/2006 | Chang et al. | |

FOREIGN PATENT DOCUMENTS

| WO | WO 2006/014849 | 2/2006 |
|---|---|---|

OTHER PUBLICATIONS

U.S. Appl. No. 60/625,342, filed May 25, 2006, Pileggi et al.

Wang, J. et al., Statndard Cell Layout with Regular Contact Placement, IEEE Trans. on Semicon. Mfg., vol. 17, No. 3, Aug. 2004.

Kang, S.M., Metal-Metal Matrix (M3) for High-Speed MOS VLSI Layout, IEEE Trans. on CAD, vol. CAD-6, No. 5, Sep. 1987.

Liebmann, L. W., Layout Impact of Resolution Enhancement Techniques: Impediment or Opportunity?, International Symposium on Physical Design, 2003.

Jhaveri, T. et al., Maximization of Layout Printability/Manufacturability by Extreme Layout Regularity, Proc. of the SPIE, Apr. 2006.

ACAR, et al., "A Linear-Centric Simulation Framework for Parametric Fluctuations", 2002, IEEE, Carnegie Mellon University USA, pp. 1-8.

Amazawa, et al., "Fully Planarized Four-Level Interconnection with Stacked VLAS Using CMP of Selective CVD-A1 and Insulator and its Application to Quarter Micron Gate Array LSIs", 1995, IEEE, Japan, pp. 473-476.

Burkhardt, et al., "Dark Field Double Dipole Lithography (DDL) for Back-End-Of-Line Processes", 2007, SPIE Proceeding Series, vol. 6520; 65200K.

Capetti, et al., "Sub k1=0.25 Lithography with Double Patterning Technique for 45nm Technology Node Flash Memory Devices at λ=193nm", 2007, SPIE Proceeding Series, vol. 6520; 65202K.

Chandra, et al., "An Interconnect Channel Design Methodology for High Performance Integrated Circuits", 2004, IEEE, Carnegie Mellon University, pp. 1-6.

Cheng, et al., "Feasibility Study of Splitting Pitch Technology on 45nm Contact Paterning with 0.93 NA", 2007, SPIE Proceeding Series, vol. 6520; 65202N.

Chow, et al., "The Design of a SRAM-Based Field-Programmable Gate Array—Part II: Circuit Design and Layout", 1999, IEEE, vol. 7 #3 pp. 321-330.

DeVor, et al., "Statistical Quality Design and Control", 1992, Macmillan Publishing Company, pp. 264-267.

Dusa, et al. "Pitch Doubling Through Dual Patterning Lithography Challenges in Integration and Litho Budgets", 2007, SPIE Proceeding Series, vol. 6520; 65200G.

El-Gamal, "Fast, Cheap and Under Control: The Next Implementation Fabric", Jun. 2-6, 2003, ACM Press, pp. 354-355.

Frankel, "Quantum State Control Interference Lithography and Trim Double Patterning for 32-16nm Lithography", 2007, SPIE Proceeding Series, vol. 6520; 65202L.

Hayashida, et al., "Manufactuable Local Interconnect technology Fully Compatible with Titanium Salicide Process", Jun. 11-12, 1991, VMIC Conference.

Heng, et al., "A VLSI Artwork Legalization Technique Base on a New Criterion of Minimum Layout Perturbation", 1997, ACM Press, pp. 116-121.

Hu, et al., "Synthesis and Placemant Flow for Gain-Based Programmable Regular Fabrics", Apr. 6-9, 2003, ACM Press, pp. 197-203.

Hutton, et al., "A Methodology for FPGA to Structured-ASIC Synthesis and Verification", 2006, EDAA, pp. 64-69.

Jayakumar, et al., "A Metal and VIA Maskset Programmable VLSI Design Methodology using PLAs", 2004, IEEE, pp. 590-594.

Kheterpal, et al., "Routing Architecture Exploration for Regular Fabrics", DAC, Jun. 7-11, 2004, ACM Press, pp. 204-207.

Kheterpal, et al., "Design Methodolgy for IC Manufactrability Based on Regular Logic-Bricks", DAC, Jun. 13-17, 2005, IEEE/AMC, vol. 6520.

Kim, et al., "Issues and Challenges of Double Patterning Lithography in DRAM", 2007, SPIE Proceeding Series, vol. 6520; 65200H.

Kim, et al., "Double Exposure Using 193nm Negative Tone Photoresist", 2007, SPIE Proceeding Series, vol. 6520; 65202M.

Koorapaty, et al., "Exploring Logic Block Granularity for Regular Fabrics", 2004, IEEE, pp. 1-6.

Li, et al., "A Linear-Centric Modeling Approach to Harmonic Balance Analysis", 2002, IEEE, pp. 1-6.

Li, et al., "Nonlinear Distortion Analysis Via Linear-Centric Models", 2003, IEEE, pp. 897-903.

Liebmann et al., "Integrating DfM Components Into a Cohesive Design-To-Silicon Solution", IBM Systems and Technology Group, b IBM Research, pp. 1-12, 2005.

Liebmann, et al., "High-Performance Circuit Design for the RET-Enabled 65nm Technology Node", Feb. 26-27, 2004, SPIE Proceeding Series, vol. 5379 pp. 20-29.

Liu, et al., "Double Patterning with Multilayer Hard Mask Shrinkage for Sub-0.25 k1 Lithography", 200, SPIE Proceeding Series, vol. 6520; 65202J.

Mo, et al., "PLA-Based Regular Structures and Their Synthesis", 2003, Department of Electrical Engineering and Computer Sciences, IEEE, pp. 723-729.

Mo, et al., "Regular Farbrics in Deep Sub-Micron Integrated-Circuit Design", 2004, Kluwer Academic Publishers, Entire Book.

Op de Beek, et al., "Manufacturability issues with Double Patterning for 50nm half pitch damscene applications, using RELACS® shrink and corresponding OPC", 2007, SPIE Proceeding Series, vol. 6520; 65200I.

Or-Bach, "Programmable Circuit Fabrics", Sep. 18, 2001, e-ASIC pp. 1-36.

Otten, et al., "Planning for Performance", DAC 1998, ACM Inc., pp. 122-127.

Pandini, et al., "Congestion-Aware Logic Synthesis", 2002, IEEE, pp. 1-8.

Pandini, et al., "Understanding and Addressing the Impact of Wiring Congestion During Technology Mapping", ISPD Apr. 7-10, 2002, ACM Press, pp. 131-136.

Poonawala, et al., "ILT for Double Exposure Lithography with Conventional and Novel Materials", 2007, SPIE Proceeding Series, vol. 6520; 65202Q.

Ran, et al., "An Integrated Design Flow for a Via-Configurable Gate Array", 2004, IEEE, pp. 582-589.

Ran, et al., "Via-Configurable Routing Architectures and Fast Design Mappability Estimation for Regular Fabrics", 2005, IEEE, pp. 25-32.

Reis, et al., "Physical Design Methodologies for Performance Predictability and Manufacturability", Apr. 14-16, 2004, ACM Press, pp. 390-397.

Robertson, et al., "The Modeling of Double Patterning Lithographic Processes", 2007, SPIE Proceeding Series, vol. 6520; 65200J.

Sengupta, "An Integrated CAD Framework Linking VLSI Layout Editors and Process Simulators", 1998, Thesis for Rice University, pp. 1-101.

Sengupta, et al., "An Integrated CAD Framework Linking VLSI Layout Editors and Process Simulators", 1996, SPIE Proceeding Series, vol. 2726; pp. 244-252.

Sherlekar, "Design Considerations for Regular Fabrics", Apr. 18-21, 2004, ACM Press, pp. 97-102.

Stapper, "Modeling of Defects in Integrated Circuit Photolithographic Patterns", Jul. 1, 1984, IBM, vol. 28 # 4, pp. 461-475.

Taylor, et al., "Enabling Energy Efficiency in Via-Patterned Gate Array Devices", Jun. 7-11, 2004, ACM Press, pp. 874-877.

Vanleenhove, et al., "A Litho-Only Approach to Double Patterning", 2007, SPIE Proceeding Series, vol. 6520; 65202F.

Wenren, et al., "The Improvement of Photolithographic Fidelity of Two-dimensional Structures Though Double Exposure Method", 2007, SPIE Proceeding Series, vol. 6520; 65202I.

Wilcox, et al., "Design for Manufacturability: A Key to Semiconductor Manufacturing Excellence", 1998, IEEE, pp. 308-313.

Wu, et al., "A Study of Process Window Capabilities for Two-dimensional Structures under Double Exposure Condition", 2007, SPIE Proceeding Series, vol. 6520; 65202O.

Xiong, et al., "The Constrained Via Minimization Problem for PCB and VLSI Design", 1988, ACM Press/IEEE, pp. 573-578.

Yamamoto, et al., "New Double Exposure Technique without Alternating Phase Shift Mask", 2007, SPIE Proceeding Series, vol. 6520; 652052P.

Yang, et al., "Interconnection Driven VLSI Module Placement Based on Quadratic Programming and Considering Congestion Using LFF Principles", 2004, IEEE, pp. 1243-1247.

Yao, et al., "Multilevel Routing With Redundant Via Insertion", Oct. 2006, IEEE, pp. 1148-1152.

Zheng, et al."Modeling and Analysis of Regular Symmetrically Structured Power/Ground Distribution Networks", DAC, Jun. 10-14, 2002, ACM Press, pp. 395-398.

Zhu, et al., "A Study of Double Exposure Process Design with Balanced Performance Parameters for Line/Space Applications", 2007, SPIE Proceeding Series, vol. 6520; 65202H.

Zuchowski, et al., "A Hybrid ASIC and FPGA Architecture", 2003, IEEE, pp. 187-194.

* cited by examiner

Primitive Library Database (302)

inverter(1)　　　　　　　　NAND(1)
inverter(2)　　　　　　　　NAND(2)
　　．　　　　　　　　　　　．
　　．　　　　　　　　　　　．
　　．　　　　　　　　　　　．
inverter(6)　　　　　　　　NAND(6)

NOR(1)
　　　　　　　NOR(2)
　　　　　　　　．
　　　　　　　　．
　　　　　　　　．
　　　　　　　NOR(6)

Fig. 4B

Primitive Constructed Delay Flip-Flop

| Instance Name | Inputs | Outputs | Primitive |
|---|---|---|---|
| INV1 | D | n413 | inverter(4) |
| NAND1 | D, clk | n401 | NAND(2) |
| NAND2 | n413, clk | n403 | NAND(2) |
| NOR1 | n401, n407 | n405 | NOR(3) |
| NOR2 | n405, n403 | n407 | NOR(3) |
| INV2 | clk | clk ' | inverter(2) |
| NAND3 | n405, clk ' | n409 | NAND(5) |
| NAND4 | n407, clk ' | n411 | NAND(5) |
| NOR3 | n409, Q ' | Q | NOR(4) |
| NOR4 | n411, Q | Q ' | NOR(4) |

Fig. 4C

METHODS FOR CREATING PRIMITIVE CONSTRUCTED STANDARD CELLS

CLAIM OF PRIORITY

This application is a continuation application under 35 U.S.C. 120 of prior U.S. application Ser. No. 11/169,188, filed Jun. 27, 2005 now U.S. Pat. No. 7343,581, and entitled "Methods for Creating Primitive Constructed Standard Cells."

BACKGROUND

Today, modern electronic design automation (EDA) tools synthesize a netlist from a logic description developed by a system architect. The EDA tools, i.e., synthesis tools, use a library of cells as an input to decide upon the most optimum construction of the logic description based upon the system architect's constraints, such as constraints related to area, speed, or power. The library of cells is typically called a standard cell library.

The standard cell library includes of a set of logical and physical models for each cell in the library. The logical model of the cell describes the logical function of the cell to the synthesis tool. The physical model of the cell includes performance data, area information, a polygon representation of the cell, and information used by place and route tools, i.e., tools used to physically construct the design. The standard cell library can include a large number of cells for synthesizing complex logic descriptions. Most current standard cell libraries include between 500 and 1000 cells, including drive strength variants. Drive strength variants are cells that have the same logical function but have different physical characteristics such as area, power, and performance. Typically, standard cell library development is very resource intensive, wherein the resources include human and computer resources. The performance characterization and polygon layout of each cell in the standard cell library typically represent the most resource intensive development operations, wherein the performance characterization is computer resource intensive and the polygon layout is human resource intensive.

The effectiveness of the synthesis solution depends upon the richness of the standard cell library and how well the standard cell library is suited for the intended system design. Standard cells are typically constructed such that any logic cell can be placed next to any other logic cell. Thus, a general requirement is that each standard cell be constructed in accordance with a set of rules, including specifications for cell height, border or edge characteristics, and device size limitations.

While synthesis of logic descriptions into netlists can be accomplished using current standard cell libraries, a number of shortcomings are associated with the current synthesis approach. For example, a standard cell library developer may be required to satisfy differing specifications of many system designs. To satisfy the differing system design specifications, the standard cell library developer is often required to make compromises when deciding upon the contents of the standard cell library. One approach for mitigating the need to make such compromises is for the standard cell library developer to support multiple standard cell libraries, wherein each of the multiple standard cell libraries is targeted to a particular system design specification. However, support of multiple standard cell libraries is very resource intensive. For example, each standard cell library delivery involves performance characterization and polygon layout of each cell contained therein. Additionally, modern semiconductor processes usually go through several releases in which the physical aspects of the as-fabricated cells change from what is originally defined in the standard cell library. Such changes in the physical aspects of the as-fabricated cells can affect the cell performance characterization data and/or the cell polygon layout. Thus, when physical aspects of the as-fabricated cells change, the standard cell library developer will generally need to redeliver the standard cell library models with incorporation of appropriate cell physical aspect changes.

SUMMARY

In one embodiment, a method is disclosed for transforming a logic design into an integrated circuit to be laid-out on a base array. In the method, a netlist is generated for the logic design using a standard cell library. An operation is then performed to identify a logic function for a standard cell in the netlist. In another operation, one or more primitive logic cells are identified as being needed to duplicate the logic function of the standard cell. The method further includes an operation for constructing a primitive-based version of the standard cell using the one or more primitive logic cells as previously identified. The primitive-based version of the standard cell is to be laid-out on the base array.

In another embodiment, another method is disclosed for transforming a logic design into an integrated circuit to be laid-out on a base array. The method includes generating a netlist for the logic design using connectivity defined by standard cells of a standard cell library and the logic design. The method also includes identifying a logic function of each of the standard cells used in the netlist. The logic function of each of the standard cells used in the netlist is examined to identify primitive logic cells that are needed to create a primitive constructed version of each of the standard cells used in the netlist. The method further includes creating a primitive-based cell library that includes the primitive constructed version of each of the standard cells used in the netlist. The primitive-based cell library is then used to define the logic design for integration onto the base array.

In another embodiment, a method is disclosed for creating a primitive constructed version of a standard cell that can be used to integrate logic defined by a netlist onto a base array. In the method, a particular standard cell is identified within the netlist. A logic function of the particular standard cell is then determined. The logic function of the particular standard cell is then mapped into a set of primitive logic cells to create the primitive constructed version of the particular standard cell. The set of primitive logic cells is defined based on device characteristics of the base array. Thus, the primitive constructed version of the particular standard cell can be integrated onto the base array. Once created, the primitive constructed version of the particular standard cell is included within a primitive-based cell library.

In another embodiment, a method is disclosed for converting a standard cell library into a primitive-based cell library. The method includes a first operation for identifying a logic function for a standard cell in the standard cell library. In a second operation, one or more primitive logic cells are identified as being needed to duplicate the logic function of the standard cell. In a third operation, a primitive-based version of the standard cell is constructed using the one or more primitive logic cells having been identified in the second operation. The primitive-based version of the standard cell is capable of being integrated onto a base array.

In another embodiment, a method is disclosed for creating a user-defined cell. The method includes constructing a user-defined cell from primitive logic cells, wherein the primitive logic cells are defined for integration onto a base array. The method also includes analyzing an electrical performance of the user-defined cell. Additionally, a cell-level layout of the user-defined cell is developed to determine an area to be occupied by the user-defined cell when integrated onto the base array. The method further includes storing a description of the constructed user-defined cell, the analyzed electrical performance of the user-defined cell, and the cell-level layout of the user-defined cell within a primitive-based cell library.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 4B is an illustration showing an exemplary partial listing of primitive logic cells included in the primitive library;

FIG. 4C is an illustration showing a primitive constructed version of the delay flip-flip of FIG. 4A resulting from the mapping operation;

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
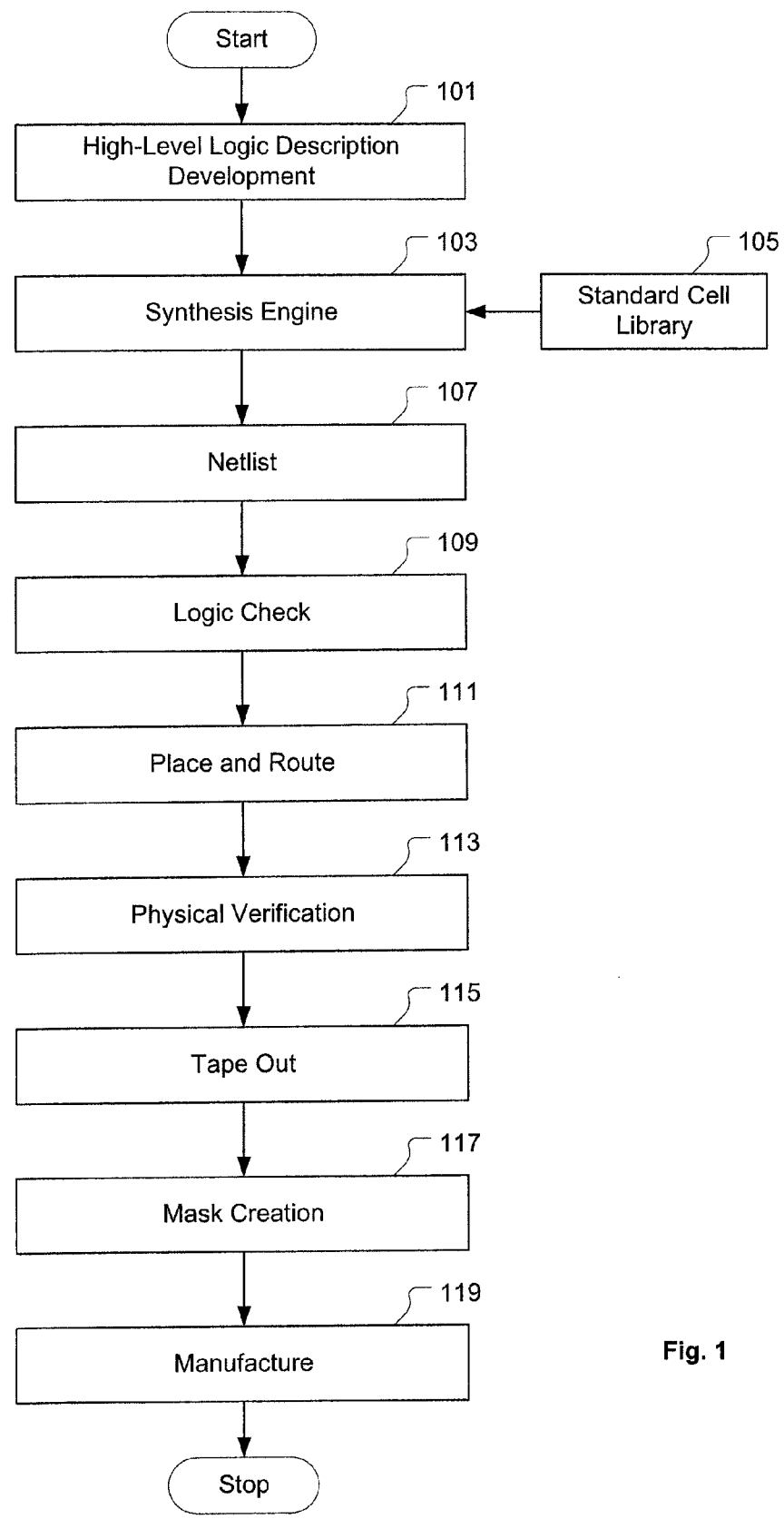
FIG. 1 is an illustration showing a design-to-manufacture flow for transforming a logic design into a manufactured integrated circuit on a processor chip.

FIG. 1 is an illustration showing a design-to-manufacture flow for transforming a logic design into a manufactured integrated circuit on a processor chip. The design-to-manufacture flow begins with an operation 101 in which a system architect develops a high-level logic description of the system. The high-level logic description of the system is often generated by the system architect using a register transfer language (RTL). The RTL provides the system architect with a language that can be used to describe the data and control requirements necessary to support execution of an instruction by logic within the processor chip. The high-level description of the system in RTL is sufficient to enable derivation of corresponding circuits and interconnections necessary to implement the system.

The system architect often develops the high-level logic description of the system using references to standard cells, wherein each standard cell represents a circuit component. In general, each standard cell description includes a layout/drawing of the cell, a mapping of a transistor schematic of the cell into maskable polygons, timing data for the cell, area information for the cell, a library exchange format (LEF) file for the cell, and cell logical models for use by a synthesis engine. The standard cells are stored in libraries that can be referenced by the system architects and are accessible by the synthesis engine.

Once completed, the high-level logic description is provided to a synthesis engine 103 which determines how to optimally use the referenced standard cells and map them into a low-level instantiation of the logic description. Thus, the synthesis engine 103 uses a standard cell library 105 as an input to the synthesis process. The synthesis process generates a netlist 107 that describes the connectivity of the standard cells defining the logic description. The netlist 107 defines which standard cells are used and how the standard cells are connected. Once the netlist 107 is generated, a logic check is performed on the netlist 107 in an operation 109. The logic check essentially confirms that the logic represented by the netlist 107 provides the functionality specified by the high-level logic description developed in operation 101.

Following the logic check, an operation 111 is performed to place and route the standard cells as identified in the netlist 107. Based on the physical dimensions and connectivity of the standard cells identified in the netlist 107, a place and route tool determines how to place the standard cells on the silicon such that interconnect distances are minimized while enabling the required connectivity between the various standard cells. Once the standard cells are placed on the silicon, all required connections are routed between the various standard cells.

After placing and routing the standard cell in operation 111, an operation 113 is performed to provide a physical verification of the circuit. The physical verification generally includes a timing verification, a design rule check (DRC), a layout versus schematic (LVS) analysis, and an electrical rule check (ERC). Once the physical verification is completed with satisfactory results, the circuit design is taped out in an operation 115. In the tape out operation 115, a description of the circuit is prepared for transmission to the manufacturer, i.e., foundry, for fabrication. In an operation 117, the manufacturer creates masks to be used in fabricating the taped out circuit. Then, in an operation 119, the circuit/chip is manufactured.

It should be appreciated by those skilled in the art that modern integrated circuit manufacturing, i.e., semiconductor manufacturing, involves the building up of layers of materials in specific patterns on a silicon wafer ("wafer"). During the build-up process, materials are deposited, removed, and/or implanted at precise locations on the wafer. A process called photolithography is commonly used to facilitate deposition, removal, and implantation of materials at precise locations on the wafer. In the photolithography process, a photoresist material is first deposited onto the wafer. The photoresist material is then exposed to light filtered by a reticle. The reticle is generally a glass plate that is covered by a mask representing exemplary feature geometries that blocks light from passing through the glass plate.

After passing through the reticle, the light contacts the surface of the photoresist material in the pattern defined by the mask. The light changes the chemical composition of the exposed photoresist material. With a positive photoresist material, exposure to the light renders the exposed photoresist material insoluble in a developing solution. Conversely, with a negative photoresist material, exposure to the light renders the exposed photoresist material soluble in the developing solution. After the exposure to the light, the soluble portion of the photoresist material is removed, leaving a patterned photoresist layer. The wafer is then processed to either remove, deposit, or implant materials in the wafer regions not covered by the patterned photoresist layer. After the wafer processing, the patterned photoresist layer is stripped from the wafer. Thus, the masks used in the photolithography process define patterns of materials to be defined on the wafer in a layered-manner to create the desired circuit as represented by the netlist of standard cells.

It should be appreciated by those skilled in the art that semiconductor manufacturing includes many other processes beyond those mentioned above. However, to avoid unnecessarily obscuring the present invention, further detail regarding specific semiconductor manufacturing processes are not described herein. Therefore, it should be understood that the present invention is not limited by a particular semiconductor manufacturing process or technology.

Conventionally, during the place and route operation 111, the standard cells can be placed on an irregular grid. However, the modern photolithography process has trouble with the irregular griding of the standard cells. For example, if standard cell features having a size of 90 nanometers are being patterned, but the wavelength of light is 193 nanometers, it is difficult to resolve the standard cell features when the standard cells are placed in an arbitrary pattern on an irregular grid. Consequently, the small feature sizes of modern integrated circuits combined with the placement of standard cells on irregular grids often yields distortion of standard cell features during the photolithography process. To compensate for this distortion, the photolithography process typically utilizes correction techniques such as reticle enhancement technology (RET) and optical proximity correction (OPC). However, use of RET and OPC results in a modification of the mask, i.e., standard cell features, without the system architect's input. The design-to-manufacture flow of FIG. 1 does not provide for efficient feedback of the RET and OPC modifications to the system architect for re-evaluation. Therefore, the logic design intended by the system architect and previously checked based on the synthesized netlist is subject to modification at the foundry without the system architect's oversight. Additionally, if the RET and OPC modifications could be provided to the system architect through a feedback mechanism, updating of the standard cell definitions to reflect the RET and OPC modifications would be prohibitively expensive in terms of computational and human resource consumption.

It should be appreciated that each standard cell can be defined in a number of different ways to provide different performance characteristics. For example, one version of a standard cell can be optimized for low leakage, while another version of the standard cell can be optimized for high speed. Thus, a single standard cell design is generally not appropriate for all design spaces. The multiple versions of the various standard cells are compiled into respective multiple standard cell libraries that are each associated with a particular performance characteristic, e.g., leakage, speed, power consumption, wherein the performance characteristics often share an inverse relationship. Each standard cell library can also include multiple variants of each standard cell contained therein. For example, variants of a given standard cell may correspond to a particular threshold voltage ($V_T$) or a particular supply voltage ($V_{dd}$). It should be further appreciated that each of the multiple standard cell libraries can include more than 600 different standard cells. Thus, it can be extremely resource intensive, if not impossible, to characterize and maintain all possible standard cell variants. Additionally, characterization and maintenance of the standard cells can be even further complicated by modification of standard cell features for manufacturability in the backend of the design-to-manufacture flow, wherein the standard cells as modified for manufacturability represent new standard cell variants that should be re-characterized to ensure proper functionality of the circuit.

The present invention provides a new method for transforming a high-level logic description into an integrated circuit. The method of the present invention provides for significant reduction in the extensive resource consumption that is traditionally required for standard cell library characterization and maintenance. The method of the present invention also eliminates problems associated with foundry modifications of standard cell features to support manufacturability in the backend of the design-to-manufacture flow.

In one embodiment, the method of the present invention represents a design-to-manufacture flow in which standard cells are compiled from a set of primitive logic cells on an as-needed basis to fulfill the requirements of a generated netlist representation of the high-level logic description. As will be discussed in greater detail below, the method of the present invention avoids the excessive resource consumption necessary to characterize and maintain all possible standard cell variants associated with conventional standard cell libraries. Additionally, compilation of the standard cells from the set of primitive logic cells as afforded by the method of the present invention is predicated on ultimately defining the integrated circuit on a base array chip. Because the primitive cells are defined based on the known device characteristics of the base array chip, the performance of the standard cells as integrated on the base array can be reliably predicted during the physical verification of the integrated circuit. Furthermore, because the base array chip manufacturability is proven prior to design, standard cell feature modifications for manufacturability, e.g., due to RET and OPC driven mask changes at the transistor level, are completely avoided.

Figure 2:
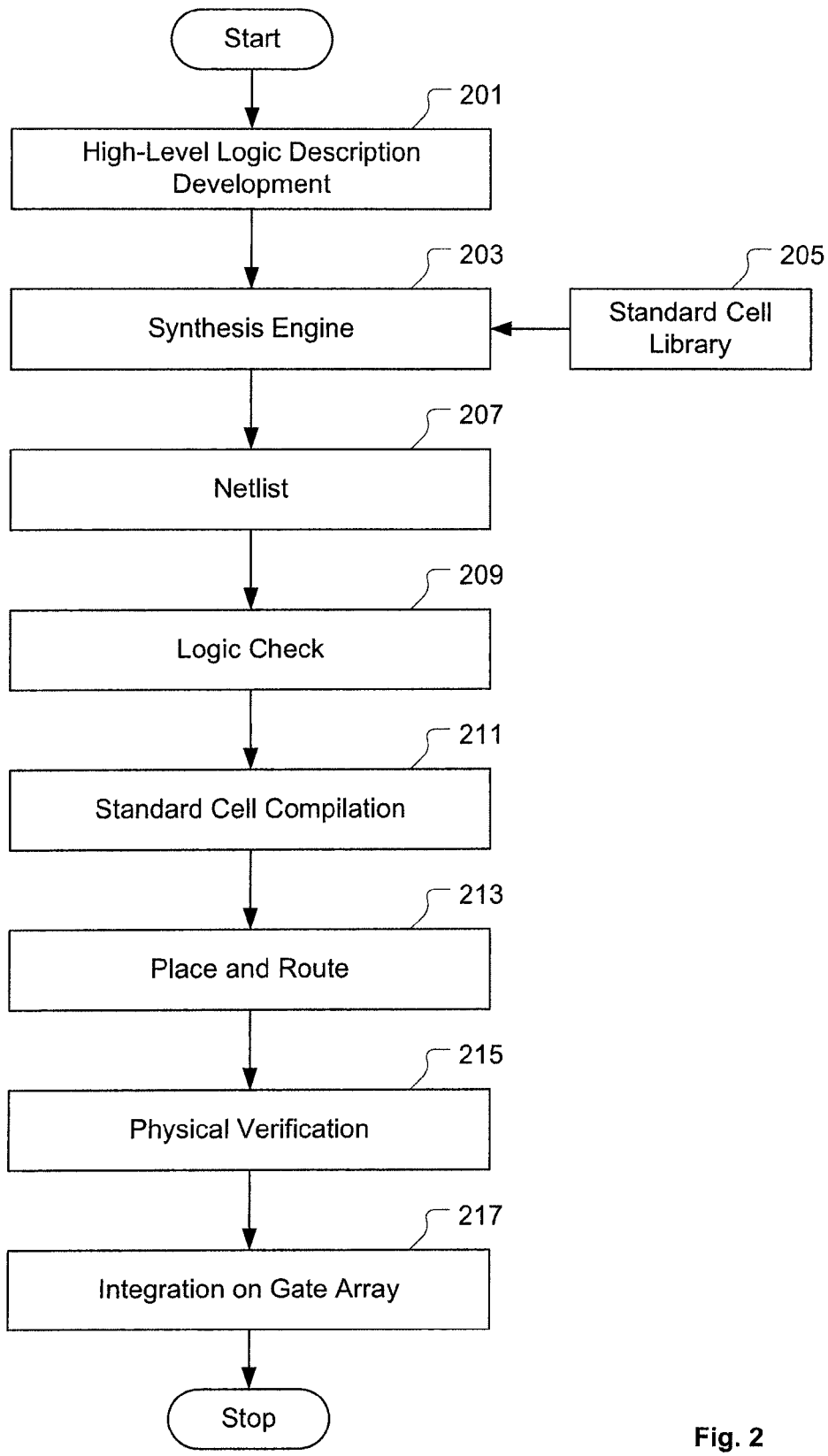
FIG. 2 is an illustration showing a design-to-manufacture flow for transforming a logic design into a manufactured integrated circuit, in accordance with one embodiment of the present invention.

FIG. 2 is an illustration showing a design-to-manufacture flow for transforming a logic design into a manufactured integrated circuit, in accordance with one embodiment of the present invention. The flow of FIG. 2 begins with an operation 201 for developing a high-level logic description of the system to be implemented as the integrated circuit. The operation 201 is essentially equivalent to the operation 101 as previously described with respect to FIG. 1. Thus, the high-level logic description of the system is sufficient to enable derivation of corresponding circuits and interconnections necessary to implement the system. Furthermore, the high-level logic description of the system is defined using references to standard cells available in a standard cell library 205.

The high-level logic description is provided to a synthesis engine 203 which determines how to optimally use the referenced standard cells and map them into a low-level instantiation of the logic description. The synthesis engine 203 functions in a manner that is essentially equivalent to the synthesis engine 103 described with respect to FIG. 1. Thus, the synthesis engine 203 uses the standard cell library 205 as an input to the synthesis process to generate a netlist 207 that describes the connectivity of the standard cells defining the logic description. As with the netlist 107 of FIG. 1, the netlist 207 defines which standard cells are used and how the standard cells are connected. Once the netlist 207 is generated, an operation 209 is performed to confirm that the logic represented by the netlist 207 provides the functionality specified by the high-level logic description developed in operation 201.

It should be appreciated that up to the logic check of operation 209, the design-to-manufacture flow of FIG. 2 is similar to the design-to-manufacture flow of FIG. 1. However, following operation 209, the design-to-manufacture flow of FIG. 2 differs significantly from the design-to-manufacture flow of FIG. 1. More specifically, following the operation 209 in FIG. 2, a standard cell compilation operation 211 is performed. The standard cell compilation operation 211 involves analysis of the netlist 207, determination of which standard cells are used in the netlist 207, and creation of a primitive-based standard cell library that includes a definition of each standard cell referenced in the netlist 207. It should be appreciated that during the standard cell compilation operation 211, only the standard cells referenced in the netlist 207 are created from the set of primitive logic cells.

The set of primitive logic cells includes cell definitions for each fundamental logic component necessary to create each referenced standard cell. In one embodiment, the set of primitive logic cells includes NAND gates, NOR gates, pass gates, latch elements, PMOS stacks, NMOS stacks, inverters, and tri-state inverters. Additionally, the set of primitive logic cells are defined based on specifications of a target base array upon which the integrated circuit will be laid-out. If the target base array supports multiple performance specifications, e.g., a grid of transistors optimized for increased speed and grid of transistors optimized for decreased leakage, separate sets of primitive logic cells will be defined and available for each of the multiple performance specifications. Thus, performance characteristics of each primitive logic cell will be known upon creation of each primitive-based standard cell. Hence, the expected performance of each primitive-based standard cell integrated on the target base array can be accurately predicted as part of the standard cell compilation operation 211.

The primitive-based standard cells created in the standard cell compilation operation 211 are complied into a primitive-based standard cell library. The primitive-based standard cell library includes a definition of each standard cell referenced in the netlist 207. Using the primitive-based standard cell library and the netlist 207, an operation 213 is performed to place and route the standard cells as identified in the netlist 207. It should be appreciated that the primitive-based standard cells are placed and routed based on the specifications of the target base array within which the primitive-based standard cells will be ultimately integrated.

Following the place and route operation 213, an operation 215 is performed to provide a physical verification of the circuit. As in the physical verification of operation 113, the physical verification of operation 215 generally includes a timing verification, a design rule check (DRC), a layout versus schematic (LVS) analysis, and an electrical rule check (ERC). Once the physical verification is completed with satisfactory results, the circuit design is integrated on the target base array in an operation 217.

Use of a base array chip having a standard grid of transistors provides for predictable patterns and distortion characteristics when features are patterned during the base array chip manufacturing process. These predictable patterns and distortion characteristics enables more accurate RET and OPC, which results in fabrication of transistors that perform more reliably. In addition to more reliable performance characteristics, use of the base array in the design-to-manufacture method of the present invention avoids the issue of having to provide transistor level RET/OPC mask modification feedback to the system architect. Furthermore, when using the base array in the present invention, the primitive-based standard cells are mapped directly from the virtual part of the design-to-manufacture flow onto the base array. Therefore, once the place and route operation 213 is performed using virtual representations of the primitive-based standard cells, the primitive-based standard cells can be integrated essentially anywhere on the base array chip.

In one embodiment, the operation 217 can be performed using a conventional base array chip. However, depending on the particular logic system that is being instantiated, use of the conventional base array chip may not always provide an optimal use of the available base array configuration. For example, the conventional base array may include a fixed number of devices, i.e., transistors, and a fixed number of device sizes onto which the logic system must be integrated. Therefore, in another embodiment, the operation 217 can be performed using a optimized base array chip.

The optimized base array chip can be manufactured to include an optimal arrangement of sub-arrays, wherein each sub-array includes devices, i.e., transistors, that are optimally sized for their intended function within the logic system to be integrated on the base array chip in the operation 217. Thus, in the embodiment using the optimized base array chip, transistors having different performance characteristics can be made available within a common base array chip to enable integration of the primitive-based cells required to define the logic system. It should be appreciated that the set of primitive logic cells used to create the primitive-based cell library correspond to the available device characteristics that can be defined within the optimized base array chip during manufacturing. In one embodiment, the optimized base array chip is actually manufactured following the place and route operation 213 to ensure that an appropriate arrangement of sub-arrays is provided for integration of the logic system. However, in another embodiment, the optimized base array chip can be manufactured prior to the design process based on experienced gleaned from previous design-to-manufacture processes conducted for similar logic systems.

The set of primitive logic cells used in the standard cell compilation operation 211 represents an optimal set of primitive logic cells necessary to construct an entire standard cell library. Additionally, it should be appreciated that a relatively small number of primitive logic cells are required to fully describe the inventory of standard cells in a current standard cell library. Thus, the set of primitive logic cells can be fully characterized and maintained with minimal resources. As new generations of base arrays are developed, the set of primitive logic cells can be easily updated based on the specifications of the new base arrays. Then, the standard cell compilation operation 211 can be quickly re-performed to map the standard cells to the new base arrays based on the updated set of primitive logic cells. Furthermore, the standard cell compilation operation 211 enables system architects to create customized standard cells without regard to the extensive resources traditionally required to characterize and maintain conventional standard cell libraries upon insertion of new standard cell designs.

The design-to-manufacture flow of FIG. 2 enables the system architect to develop the high-level logic description based on known standard cell library compositions. Because the standard cell compilation operation 211 builds the ".lib" and ".lef" files, the standard cell compilation operation 211 can be implemented in a transparent manner with respect to a system architect who is accustom to operating within the traditional design-to-manufacture flow. Thus, the design-to-manufacture flow of FIG. 2 can be implemented without a need to retrain system architects who are comfortable with using the conventional standard cell libraries in the traditional design-to-manufacture flow.

Figure 3A:
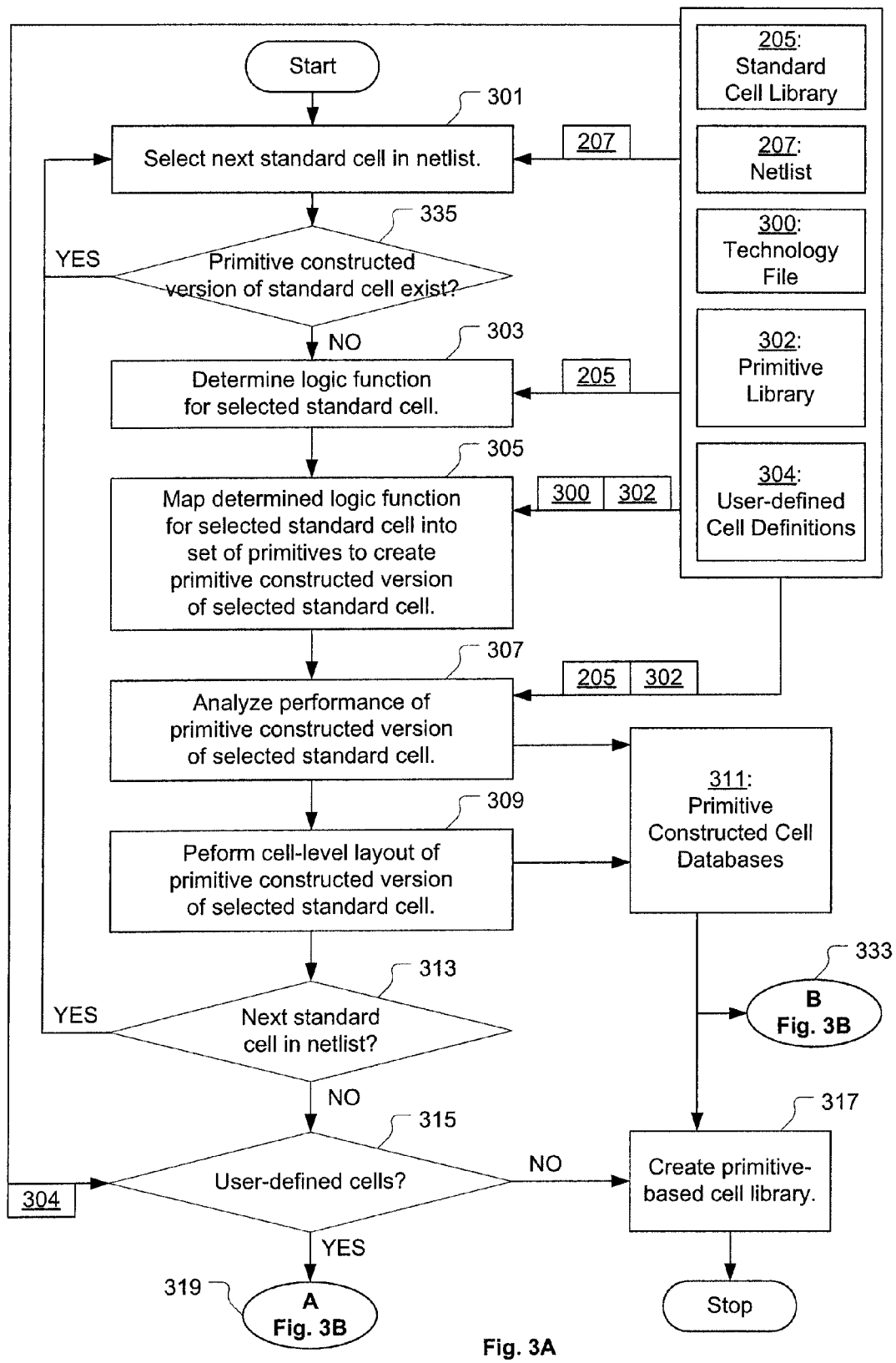
FIGS. 3A and 3B are illustrations showing a flowchart of the standard cell compilation operation of FIG. 2, in accordance with one embodiment of the present invention.
Figure 3B:
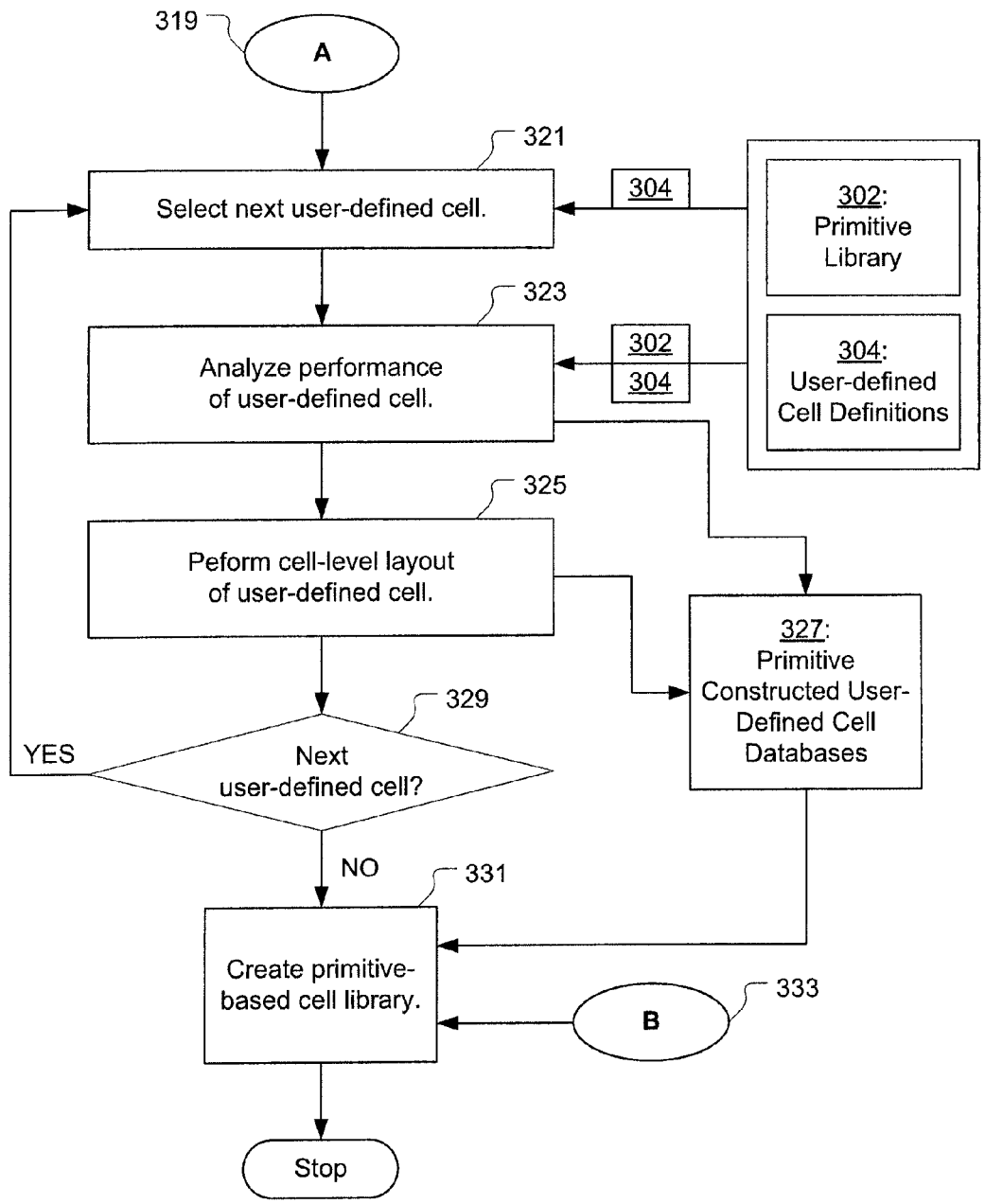

FIGS. 3A and 3B are illustrations showing a flowchart of the standard cell compilation operation 211 of FIG. 2, in accordance with one embodiment of the present invention. The standard cell compilation operation 211 utilizes a number of inputs including: a) the standard cell library 205, b) the netlist 207, c) a technology file 300, d) a primitive library 302, and e) user-defined cell definitions 304.

As previously discussed, the standard cell library 205 represents a collection of standard cells and corresponding variants. Each standard cell in the standard cell library 205 is defined by a layout/drawing of the cell, a mapping of a transistor schematic of the cell into maskable polygons, timing data for the cell, area information for the cell, a library exchange format (LEF) file for the cell, and cell logical models for use by a synthesis engine. Also as previously discussed, the netlist 207 defines which standard cells are used in the logic description of the system and how the standard cells are connected.

The technology file 300 provides specifications of the base array chip upon which the logic description of the system will be integrated. For example, the technology file 300 can identify a number of available devices and their respective characteristics such as size, speed, leakage, power consumption, etc. The primitive library 302 includes definitions of each available primitive logic cell. The definition of each primitive logic cell includes a layout/drawing of the cell, timing data for the cell, area information for the cell, a library exchange format (LEF) file for the cell, and a logical model for the cell. In one embodiment, the primitive library 302 includes 14 primitive logic cells, wherein each of the 14 primitive logic cells is represented by 6 variants corresponding to 3 different threshold voltages and 3 different supply voltages. The 14 primitive logic cells in this embodiment include: 1) a two input NAND gate, 2) a three input NAND gate, 3) a two input NOR gate, 4) a three input NOR gate, 5) a pass gate, 6) a latch element, 7) a single PMOS stack, 8) a double PMOS stack, 9) a triple PMOS stack, 10) a single NMOS stack, 11) a double NMOS stack, 12) a triple NMOS stack, 13) an inverter, and 14) a tri-state inverter. It should be appreciated, however, that the present invention is not limited to the primitive library including the 14 primitive logic cells and the 6 variants as described above. In other embodiments, a different set of primitive logic cells and variants thereof can be included in the primitive library 302.

The user-defined cell definitions 304 represent any conceivable user-defined cell that is defined from the set of primitive logic cells in the primitive library 302. Each user-defined cell is defined by a netlist of primitive logic cells, timing goals, and area goals. In one embodiment, a graphical user interface (GUI) is provided to enable a user to efficiently create user-defined cells based on the primitive library 302. In one embodiment, the GUI for creating user-defined cells will enable a user to transform any standard cell in the standard cell library 205 into a corresponding primitive constructed cell for use as a starting point to create the user-defined cell. This feature of the GUI can be particularly useful when the user-defined cell represents a modification of a standard cell.

In one embodiment, the standard cell compilation operation 211 is performed by traversing through the netlist 207 in a sequential manner from beginning to end. Upon encountering each new standard cell in the netlist 207, the standard cell will be compiled into a primitive constructed version of the standard cell. Therefore, with respect to FIG. 3A, the standard cell compilation operation 211 begins with an operation 301 for selecting a next standard cell in the netlist 207. In the operation 301, the netlist 207 is accessed as an input. An operation 335 is then performed to determine if a primitive constructed version of the selected standard cell already exists in the primitive constructed cell databases 311. If the primitive constructed version of the selected standard cell already exists, the method reverts back to operation 301 to select the next standard cell in the netlist 207. However, if the primitive constructed version of the selected standard cell does not exist, the method proceeds with an operation 303 in which a logic function for the selected standard cell is determined. In the operation 303, the standard cell library 205 is accessed as an input to identify the logic function of the selected standard cell.

Following the operation 303, an operation 305 is performed to map the determined logic function for the selected standard cell into the set of primitive logic cells included in the primitive library 302. The mapping of operation 305 includes identifying one or more primitive logic cells needed to duplicate the logic function of the selected standard cell. The mapping of operation 305 further includes constructing a primitive-based version of the standard cell using the identified one or more primitive logic cells. Thus, mapping of the selected standard cell into the set of primitive logic cells results in creation of a primitive constructed version of the selected standard cell. In the operation 305, the technology file 300 and the primitive library 302 are accessed as inputs. The technology file 300 provides information regarding the device characteristics of the base array chip, as represented by the available primitive logic cells, to enable the closest possible mapping of the selected standard cell into the set of primitive logic cells. The primitive library 302 provides the definition of each available primitive logic cell.

Figure 4A:
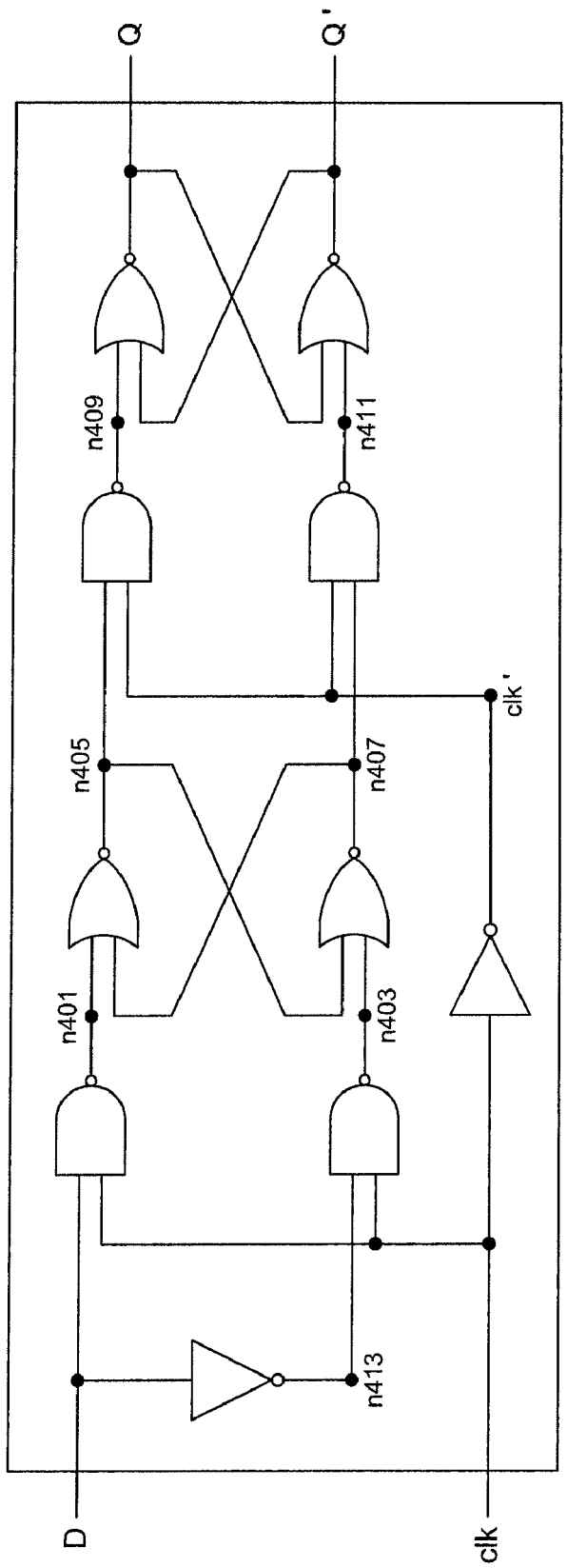
FIG. 4A shows a logic model for a standard cell defining a delay flip-flop.

FIGS. 4A-4C show an example of the mapping performed in operation 305. FIG. 4A shows a logic model for a standard cell defining a delay flip-flop. The logic defining the delay flip-flop of FIG. 4A should be readily understood by those skilled in the art. FIG. 4B is an illustration showing an exemplary partial listing of primitive logic cells included in the primitive library 302. As previously mentioned, each type of primitive logic cell, e.g., inverter, NAND, NOR, may have multiple variants included in the primitive library 302. FIG. 4C is an illustration showing a primitive constructed version of the delay flip-flip of FIG. 4A resulting from the mapping operation 305. The primitive constructed version of the delay flip-flop in FIG. 4C is represented in a netlist-type format. However, it should be appreciated that the primitive constructed version of the delay flip-flop can be defined in essentially any format that will be recognized by the place and route tools to be used in subsequent operations.

Following the mapping operation 305, an operation 307 is performed to analyze the performance of the primitive constructed version of the standard cell as created in the operation 305. The performance of the primitive constructed version of the standard cell is analyzed with respect to electrical parameters such as timing, leakage, power consumption, etc. In one embodiment, the performance of the primitive constructed version of the standard cell is compared to the target performance specifications of the standard cell, as reported in the standard cell library 205, to ensure that the performance of the primitive constructed version of the standard cell is acceptable. In another embodiment, the performance of the primitive constructed version of the standard cell is analyzed to verify compliance with user-specified electrical performance requirements, wherein the user-specified electrical performance requirements may differ from the target performance specifications of the standard cell. If the primitive constructed version of the standard cell does not satisfy the target performance specifications/requirements, a new primitive constructed version of the standard cell can be created using different primitive variants that will provide the necessary target performance. Once the primitive constructed version of the standard cell satisfies the target performance specifications/requirements, the primitive constructed version of the standard cell is recorded within a respective database within the set of primitive constructed cell databases 311.

Additionally, once the primitive constructed version of the standard cell is determined to provide the necessary target performance, an operation 309 is performed to develop a cell-level layout of the primitive constructed version of the standard cell. The cell-level layout defines the area occupied by the primitive constructed version of the standard cell within the target base array. The cell-level layout is recorded in the corresponding primitive constructed cell database 311. It should be appreciated that the cell-level layout is performed by a tool having knowledge of the cell-level layout rules associated with the target base array. Therefore, the cell-level layout tool is capable of developing cell-level layouts that can be integrated within the base array.

Following the operation 309, an operation 313 is performed to determine if a next standard cell is present in the netlist 207. If a next standard cell is present in the netlist 207, the method reverts back to operation 301 to select the next standard cell in the netlist 207. However, if a next standard cell is not present in the netlist 207, the method proceeds with an operation 315. In the operation 315, the user-defined cell definitions input 304 is examined to determine if any user-defined standard cell definitions exist. If there are user-defined cell definitions present, the method proceeds to connection "A" 319, which corresponds to an entry point into the flowchart of FIG. 3B. However, if no user-defined cell definitions are present, the method proceeds with an operation 317 in which the final primitive-based cell library is created. Creation of the final primitive-based cell library essentially represents a binding of the primitive constructed version of each referenced standard cell, as defined within the primitive constructed cell databases 311, into a single primitive-based cell library file. In one embodiment, primitive-based cell library file created in operation 317 is designated "cells.lib" to conform with standard nomenclature that is familiar to system architects.

FIG. 3B is a continuation of the standard cell compilation operation 211 represented by the flowchart of FIG. 3A. If user-defined cell definitions exist, the method enters FIG. 3B at the connection "A" 319. From connection "A" 319, the method proceeds to an operation 321 in which a next user-defined cell is selected from within the user-defined cell definitions 304. It should be understood that the user-defined cell definitions are created using the primitive logic cells that are available within the primitive library 302.

Following the operation 321, an operation 323 is performed to analyze the performance of the user-defined cell. As with the performance analysis performed in operation 307, the performance of the user-defined cell is analyzed with respect to electrical parameters such as timing, leakage, power consumption, etc. The performance of the user-define cell is compared to the performance goals as reported in the user-defined cell definitions 304 to ensure that the performance of the user-defined cell is acceptable. If the user-defined cell does not satisfy the associated performance goals, a new/modified user-defined cell can be created using different primitive variants that will satisfy the performance goals. Once the user-defined cell performance analysis shows compliance with the performance goals, the user-defined cell is recorded in a respective database within the set of primitive constructed user-defined cell databases 327.

It should be appreciated, that performance analysis of the user-defined cells in the operation 323 provides significant capability to a system architect who needs to expand beyond the contents of the standard cell library 205. Additionally, in accordance with the method of the present invention, the system architect is not required to incorporate the user-defined cell into the standard cell library 205. Thus, a user can define custom logic cells without concern regarding the extensive resources required to re-characterize and maintain the conventional standard cell libraries.

Following the operation 323, an operation 325 is performed to develop a cell-level layout of the user-defined cell. The cell-level layout defines the area occupied by the user-defined cell within the target base array. The cell-level layout is recorded in the corresponding primitive constructed user-defined cell database 327. It should be appreciated that the cell-level layout is performed by a tool having knowledge of the cell-level layout rules associated with the target base array. Therefore, the cell-level layout tool is capable of developing cell-level layouts that can be integrated within the base array.

Following the operation 325, an operation 329 is performed to determine if a next user-defined cell is present. If a next user-defined cell is present, the method reverts back to operation 321 to select the next user defined cell. However, if a next user-defined cell is not present, the method proceeds with an operation 331 in which the final primitive-based cell library is created. Creation of the final primitive-based cell library essentially represents a compilation of all the primitive constructed cell databases 311 and all the primitive constructed user-defined cell databases 327 into a single library file. The primitive constructed cell databases 311 are accessible to the operation 331 through the connection "B" 333 defined between FIGS. 3A and 3B. In one embodiment, the primitive-based cell library file created in operation 331 is designated "cells.lib" to conform with standard nomenclature that is familiar to system architects.

The standard cell compilation operation 211 performed within the context of the design-to-manufacture flow of FIG. 2 has been described above with respect to FIGS. 3A-3B. However, it should be appreciated that standard cell compilation can also be performed outside the context of the design-to-manufacture flow of FIG. 2. For example, a primitive constructed version of each cell in a standard cell library can be created outside the design-to-manufacture flow. Then, the system architect can simply use the primitive-based standard cell library when developing the high-level logic description of the system to be integrated on the target base array.

Figure 5:
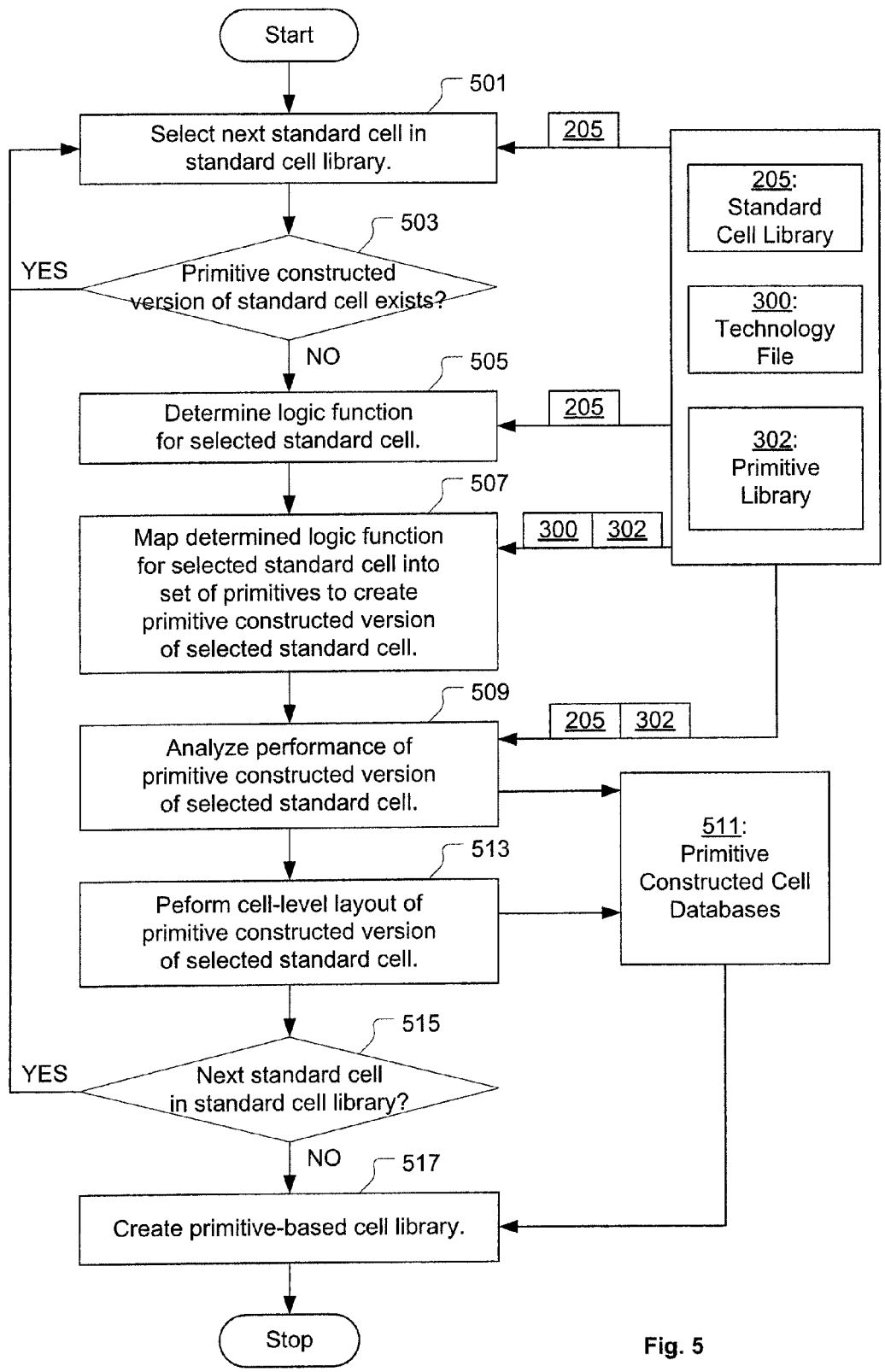
FIG. 5 is an illustration showing a flowchart of a method for compiling a standard cell library into a primitive-based standard cell library outside of the design-to-manufacture flow, in accordance with one embodiment of the present invention.

FIG. 5 is an illustration showing a flowchart of a method for compiling a standard cell library into a primitive-based cell library outside of the design-to-manufacture flow, in accordance with one embodiment of the present invention. The method begins with an operation 501 for selecting a next standard cell in the standard cell library 205. Then, in an operation 503, a determination is made as to whether a primitive constructed version of the selected standard cell already exists. If so, the method reverts back to the operation 501. Otherwise, the method proceeds with an operation 505 in which a logic function of the selected standard cell is determined. Then, in an operation 507, the logic function of the selected standard cell is mapped into the set of primitive logic cells in the primitive library 302 to create a primitive constructed version of the selected standard cell.

The method continues with an operation 509 in which the electrical performance of the primitive constructed version of the standard cell is analyzed. The performance of the primitive constructed version of the standard cell is compared to the target performance specifications of the standard cell, as reported in the standard cell library 205, to ensure that the performance of the primitive constructed version of the standard cell is acceptable. If the primitive constructed version of the standard cell does not satisfy the target performance specification of the standard cell, a new primitive constructed version of the standard cell can be created using different primitive variants that will provide the target performance as reported in the standard cell library 205. Once the primitive constructed version of the standard cell satisfies the target performance requirements, the primitive constructed version of the standard cell is recorded within a respective database within a set of primitive constructed cell databases 511.

The method continues with an operation 513 for developing a cell-level layout of the primitive constructed version of the standard cell. The cell-level layout defines the area occupied by the primitive constructed version of the standard cell within the target base array. The cell-level layout is recorded in the corresponding primitive constructed cell database 511. It should be appreciated that the cell-level layout is performed with consideration of the layout rules associated with the target base array. Following the operation 513, an operation 515 is performed to determine if a next standard cell is present in the standard cell library. If so, the method reverts back to the operation 501. Otherwise, the method proceeds with an operation 517 in which the final primitive-based cell library is created.

Creation of the final primitive-based cell library essentially represents a compilation of all the primitive constructed cell databases 511 into a single library file. In one embodiment, primitive-based cell library file created in operation 517 is designated "cells.lib" to conform with standard nomenclature that is familiar to system architects. It should be appreciated that each of the operations 501, 503, 505, 507, 509, 513, 515, and 517 are essentially equivalent to the operations 301, 335, 303, 305, 307, 309, 313, and 317, respectively, as previously described with respect to FIG. 3A, with the exception that each of the standard cells represented in the standard cell library 205 are processed as opposed to just the standard cells represented in the netlist 207.

Figure 6:
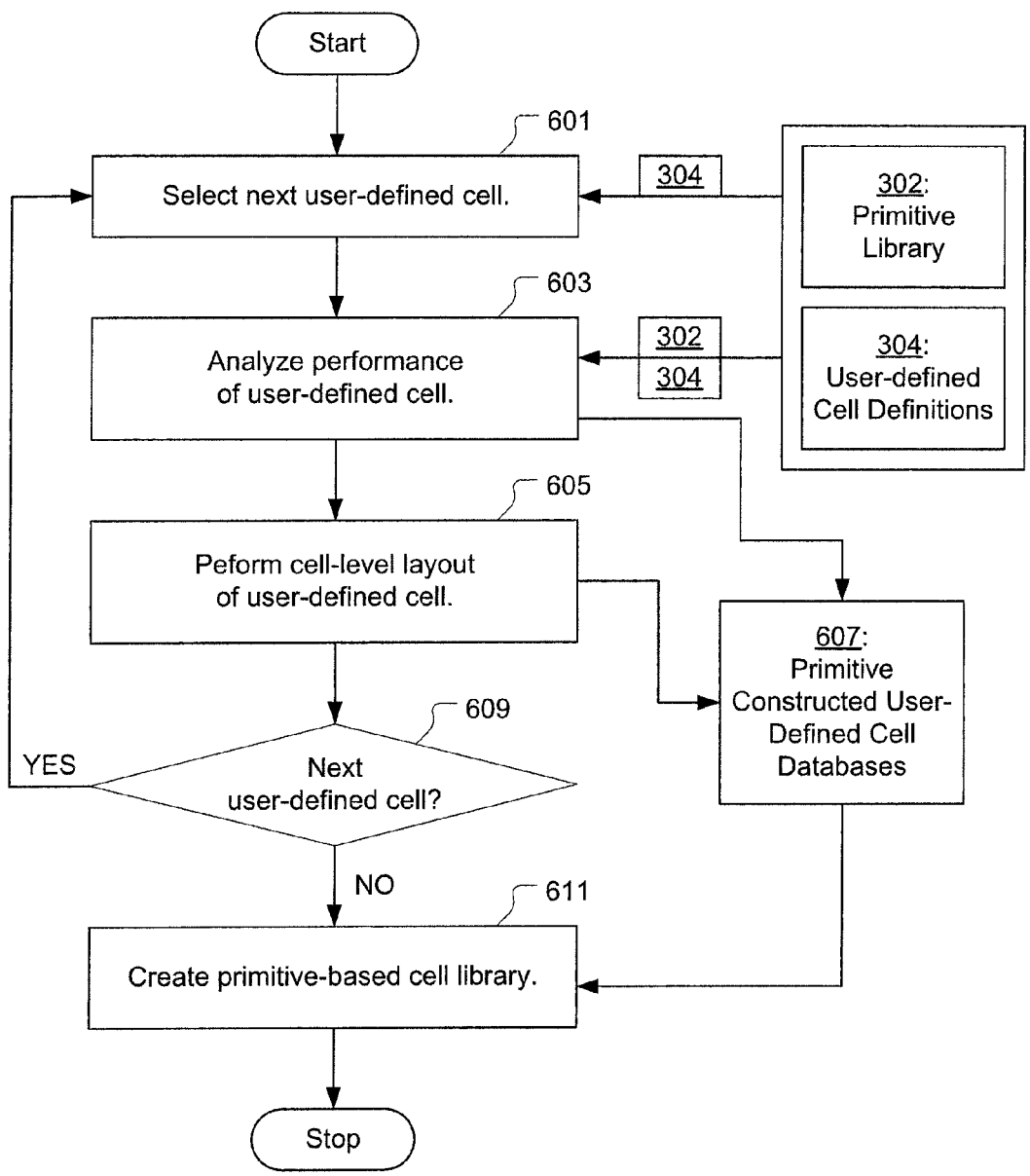
FIG. 6 is an illustration showing a flowchart of a method for creating primitive constructed user-defined cells outside of the design-to-manufacture flow, in accordance with one embodiment of the present invention.

The creation of primitive constructed user-defined cells has been described above in the context of the standard cell compilation operation 211 (FIGS. 3A-3B) performed as part of the design-to-manufacture flow. However, it should be appreciated that creation of primitive constructed user-defined cells can also be performed outside the context of the design-to-manufacture flow. FIG. 6 is an illustration showing a flowchart of a method for creating primitive constructed user-defined cells outside of the design-to-manufacture flow, in accordance with one embodiment of the present invention. The method begins with an operation 601 in which a next user-defined cell is selected from within the user-defined cell definitions 304. As previously discussed, the user-defined cell definitions are created using the primitive logic cells that are available within the primitive library 302.

The method proceeds from the operation 601 to an operation 603 in which a performance analysis of the user-defined cell is conducted. The user-defined cell is analyzed with respect to electrical parameters such as timing, leakage, power consumption, etc. The performance of the user-defined cell is compared to the performance goals as reported in the user-defined cell definitions 304 to ensure that the performance of the user-defined cell is acceptable. If the user-defined cell does not satisfy the associated performance goals, a new/modified user-defined cell can be created using different primitive variants that will satisfy the performance goals. Once the user-defined cell analysis shows compliance with the performance goals, the user-defined cell is recorded in a respective database within a set of primitive constructed user-defined cell databases 607.

Following the operation 603, an operation 605 is performed to develop a cell-level layout of the user-defined cell. The cell-level layout defines the area occupied by the user-defined cell within the target base array. The cell-level layout is recorded in the corresponding primitive constructed user-defined cell database 607. It should be appreciated that the cell-level layout is performed with consideration of the layout rules associated with the target base array. The method continues with an operation 609 to determine if a next user-defined cell is present. If a next user-defined cell is present, the method reverts back to operation 601. Otherwise, the method proceeds with an operation 611 in which all the primitive constructed cell databases 607 are compiled into a single library file. In one embodiment, the primitive-based cell library file created in operation 611 is designated "cells.lib" to conform with standard nomenclature that is familiar to system architects. It should be appreciated that each of the operations 601, 603, 605, 609, and 611 are essentially equivalent to the operations 321, 323, 325, 329, and 331, respectively, as previously described with respect to FIG. 3B, with the exception that the user-defined cells are processed outside of the standard cell compilation operation 211.

In addition to the methods for creating primitive constructed standard cells and user-defined cells as described above, the present invention also provides a method for creating a primitive constructed version of a logic cell that is not necessarily considered a standard cell. For example, this method can be used to create logic variants of peripheral cells of a memory array. These logic variants of the peripheral cells of the memory array can then be used to create a wide range of memory functionality around a core memory array. Examples of the peripheral cells of the memory array for which primitive constructed versions may be created include FIFO cells, register cells, shifter cells, output conditioning cells, test cells, and many others as known to those skilled in the art.

Figure 7:
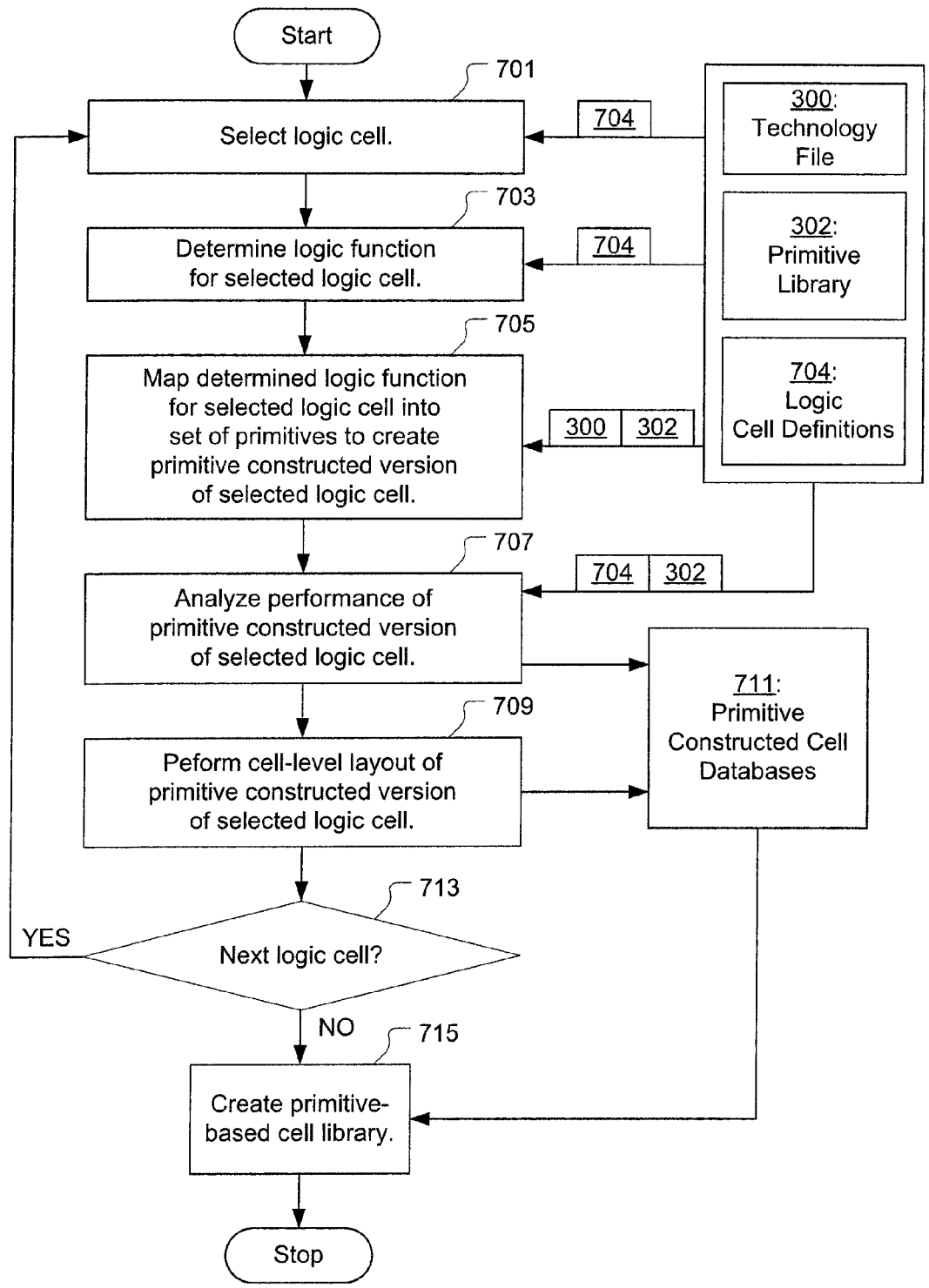
FIG. 7 is an illustration showing a flowchart of a method for creating a primitive constructed version of a logic cell that is not necessarily considered a standard cell, in accordance with one embodiment of the present invention.

FIG. 7 is an illustration showing a flowchart of a method for creating a primitive constructed version of a logic cell that is not necessarily considered a standard cell, in accordance with one embodiment of the present invention. The method begins with an operation 701 in which a logic cell is selected from within a set of logic cell definitions 704. In one embodiment, each logic cell definition includes an electronic, i.e., circuit, description of the logic cell, timing goals for the logic cell, and area goals for the logic cell. The method proceeds with an operation 703 in which a logic function for the selected logic cell is determined. In the operation 703, the logic cell definitions 704 is accessed as an input to identify the logic function of the selected logic cell.

Following the operation 703, an operation 705 is performed to map the determined logic function for the selected logic cell into the set of primitive logic cells included in the primitive library 302. The mapping of operation 705 includes identifying one or more primitive logic cells needed to duplicate the logic function of the selected logic cell. The mapping of operation 705 further includes constructing a primitive-based version of the logic cell using the identified one or more primitive logic cells. Thus, mapping of the selected logic cell into the set of primitive logic cells results in creation of a primitive constructed version of the selected logic cell. In the operation 705, the technology file 300 and the primitive library 302 are accessed as inputs. As previously discussed, the technology file 300 provides information regarding the device characteristics of the base array chip, as represented by the available primitive logic cells, to enable the closest possible mapping of the selected logic cell into the set of primitive logic cells. Also, as previously discussed, the primitive library 302 provides the definition of each available primitive logic cell.

The method continues with an operation 707 for analyzing the performance of the primitive constructed version of the logic cell as created in the operation 705. The performance of the primitive constructed version of the logic cell is analyzed with respect to electrical parameters such as timing, leakage, power consumption, etc. In one embodiment, the performance of the primitive constructed version of the logic cell is analyzed to verify compliance with electrical performance goals set forth in the logic cell definitions 704. If the primitive constructed version of the logic cell does not comply with the electrical performance goals, a new primitive constructed version of the logic cell can be created using different primitive variants that will enable compliance with the electrical performance goals. Once the primitive constructed version of the logic cell complies with the electrical performance goals, the primitive constructed version of the logic cell is recorded within a respective database within a set of primitive constructed cell databases 711.

Additionally, once the primitive constructed version of the logic cell is determined to comply with the electrical performance goals, an operation 709 is performed to develop a cell-level layout of the primitive constructed version of the logic cell. The cell-level layout defines the area occupied by the primitive constructed version of the logic cell within the target base array. The cell-level layout is recorded in the corresponding primitive constructed cell database 711. It should be appreciated that the cell-level layout is performed by a tool having knowledge of the cell-level layout rules associated with the target base array. Therefore, the cell-level layout tool is capable of developing cell-level layouts that can be integrated within the base array.

Following the operation 709, an operation 713 is performed to determine if a primitive constructed version of another logic cell needs to be created. If so, the method reverts back to operation 701. Otherwise, the method proceeds with an operation 715 for creating a primitive-based cell library. Creation of the primitive-based cell library essentially represents a binding of the primitive constructed version of each logic cell, as defined within the primitive constructed cell databases 711, into a single primitive-based cell library file. In one embodiment, primitive-based cell library file created in operation 715 is designated "cells.lib" to conform with nomenclature that is familiar to system architects.

It should be appreciated that in one embodiment the method of FIG. 7 can be implemented in a stand-alone manner. Additionally, in another embodiment, the method of FIG. 7 can be implemented in conjunction with the method of FIGS. 3A-3B. Such that the primitive-based cell library created in FIGS. 3A-3B can also include primitive constructed versions of logic cells that are not necessarily considered standard cells.

The invention described herein can be embodied as computer readable code on a computer readable medium. The computer readable medium is any data storage device that can store data which can be thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion. Additionally, a graphical user interface (GUI) implemented as computer readable code on a computer readable medium can be developed to provide a user interface for performing any embodiment of the present invention.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for transforming a logic design into an integrated circuit to be laid-out on a base array, comprising:
    (a) generating a netlist for the logic design using a standard cell library;
    (b) identifying a logic function for a standard cell in the netlist;
    (c) identifying one or more primitive logic cells needed to duplicate the logic function of the standard cell, wherein each of the one or more primitive logic cells is not a standard cell; and
    (d) operating a computer to construct a primitive-based version of the standard cell using the identified one or more primitive logic cells, the primitive-based version of the standard cell to be laid-out on the base array.

2. A method for transforming a logic design into an integrated circuit to be laid-out on a base array as recited in claim 1, further comprising:
    performing operations (b), (c), and (d) for each unique standard cell in the netlist.

3. A method for transforming a logic design into an integrated circuit to be laid-out on a base array as recited in claim 2, further comprising:
    creating a primitive-based cell library to include the primitive-based version of the standard cell as constructed in operation (d) for each unique standard cell in the netlist.

4. A method for transforming a logic design into an integrated circuit to be laid-out on a base array as recited in claim 3, further comprising:
    placing and routing the primitive-based version of the standard cells in the primitive-based cell library to define the integrated circuit to be laid-out on the base array.

5. A method for transforming a logic design into an integrated circuit to be laid-out on a base array as recited in claim 1, wherein the operation (d) includes,
    analyzing an electrical performance of the primitive-based version of the standard cell to verify duplication of an electrical performance of the standard cell, and
    perfolming a cell-level layout of the primitive-based version of the standard cell to determine an area to be occupied by the primitive-based version of the standard cell on the base array.

6. A method for transforming a logic design into an integrated circuit to be laid-out on a base array as recited in claim 1, wherein the primitive logic cells are defined based on device characteristics of the base array.

7. A method for transforming a logic design into an integrated circuit to be laid-out on a base array as recited in claim 1, wherein the primitive logic cells are maintained within a primitive library, the primitive library including variants of each primitive logic cell for use in constructing the primitive-based version of the standard cell.

8. A method for transforming a logic design into an integrated circuit to be laid-out on a base array as recited in claim 1, wherein the operation (d) includes,
analyzing an electrical performance of the primitive-based version of the standard cell to verify compliance with user-specified electrical performance requirements.

9. A method for transforming a logic design into an integrated circuit to be laid-out on a base array, comprising:
generating a netlist for the logic design, the generation of the netlist utilizing connectivity defined by standard cells of a standard cell library and the logic design;
identifying a logic function of each of the standard cells used in the netlist, the logic function of each of the standard cells used in the netlist being examined to identify primitive logic cells needed to create a primitive constructed version of each of the standard cells used in the netlist, wherein each of the primitive logic cells is not a standard cell;
operating a computer to create a primitive-based cell library that includes the primitive constructed version of each of the standard cells used in the netlist; and
using the primitive-based cell library to define the logic design for integration onto the base array.

10. A method for transforming a logic design into an integrated circuit to be laid-out on a base array as recited in claim 9, wherein the primitive logic cells are maintained within a primitive library, each primitive logic cell being defined based on device characteristics of the base array.

11. A method for transforming a logic design into an integrated circuit to be laid-out on a base array as recited in claim 9, further comprising:
creating the primitive constructed version of each of the standard cells used in the netlist by using the identified primitive logic cells, the creating including analyzing an electrical performance of the primitive constructed version of each of the standard cells to verify duplication of an electrical performance of the respective standard cell of the standard cell library, and perfouning a cell-level layout of the primitive constructed version of each of the standard cells.

12. A method for transforming a logic design into an integrated circuit to be laid-out on a base array as recited in claim 9, further comprising:
creating the primitive constructed version of each of the standard cells used in the netlist by using the identified primitive logic cells, the creating including analyzing an electrical performance of the primitive constructed version of each of the standard cells to verify compliance with user-specified electrical performance requirements, and performing a cell-level layout of the primitive constructed version of each of the standard cells.

13. A method for creating a primitive constructed version of a standard cell, wherein the primitive constructed version of the standard cell can be used to integrate logic defined by a netlist onto a base array, comprising:
identifying a standard cell within the netlist;
determining a logic function of the identified standard cell;
mapping the determined logic function of the identified standard cell into a set of primitive logic cells to create the primitive constructed version of the identified standard cell, wherein the set of primitive logic cells is defined based on device characteristics of the base array, and wherein each primitive logic cell in the set of primitive logic cells is not a standard cell; and
storing the primitive constructed version of the identified standard cell as computer readable code within a cell library on a data storage device for storing data to be read by a computer system.

14. A method for creating a primitive constructed version of a standard cell, wherein the primitive constructed version of the standard cell can be used to integrate logic defined by a netlist onto a base array as recited in claim 13, further comprising:
analyzing an electrical performance of the primitive constructed version of the identified standard cell;
modifying the primitive constructed version of the identified standard cell as necessary to obtain an equivalency between the electrical performance of the primitive constructed version of the identified standard cell and an electrical performance of the identified standard cell; and
developing a cell-level layout of the primitive constructed version of the identified standard cell.

15. A method for creating a primitive constructed version of a standard cell, wherein the primitive constructed version of the standard cell can be used to integrate logic defined by a netlist onto a base array as recited in claim 13, further comprising:
analyzing an electrical performance of the primitive constructed version of the identified standard cell;
modifying the primitive constructed version of the identified standard cell as necessary to comply with user-specified electrical performance requirements; and
developing a cell-level layout of the primitive constructed version of the identified standard cell.

16. A method for creating a primitive constructed version of a standard cell, wherein the primitive constructed version of the standard cell can be used to integrate logic defined by a netlist onto a base array as recited in claim 13, wherein the netlist represents a synthesized high-level logic description of a system developed based on standard cells available in a standard cell library.

17. A method for creating a primitive constructed version of a standard cell, wherein the primitive constructed version of the standard cell can be used to integrate logic defined by a netlist onto a base array as recited in claim 13, wherein the set of primitive logic cells is defined to include a minimal number of primitive logic cells necessary to create the primitive constructed version of each standard cell in a standard cell library.

18. A method for converting a standard cell library into a primitive-based cell library, comprising:
(a) identifying a logic function for a standard cell in the standard cell library;
(b) identifying one or more primitive logic cells needed to duplicate the logic function of the standard cell, wherein each of the one or more primitive logic cells is not a standard cell; and
(c) operating a computer to construct a primitive-based version of the standard cell using the identified one or more primitive logic cells, the primitive-based version of the standard cell capable of being integrated onto a base array.

19. A method for converting a standard cell library into a primitive-based cell library as recited in claim 18, further comprising:
performing operations (a), (b), and (c) for each standard cell in the standard cell library.

20. A method for converting a standard cell library into a primitive-based cell library as recited in claim 19, further comprising:
creating a primitive-based cell library to include the primitive-based version of the standard cell constructed for each standard cell in the standard cell library.

21. A method for converting a standard cell library into a primitive-based cell library as recited in claim 18, wherein the operation (c) includes,
analyzing an electrical performance of the primitive-based version of the standard cell to verify duplication of an electrical performance of the standard cell as reported in the standard cell library, and
performing a cell-level layout of the primitive-based version of the standard cell to determine an area to be occupied by the primitive-based version of the standard cell when integrated onto the base array.

22. A method for converting a standard cell library into a primitive-based cell library as recited in claim 18, wherein the operation (c) includes,
analyzing an electrical performance of the primitive-based version of the standard cell to verify compliance with user-specified electrical performance requirements, and
performing a cell-level layout of the primitive-based version of the standard cell to determine an area to be occupied by the primitive-based version of the standard cell when integrated onto the base array.

23. A method for converting a standard cell library into a primitive-based cell library as recited in claim 18, wherein the one or more primitive logic cells are identified within a set of primitive logic cells, the set of primitive logic cells being defined to include a minimal number of primitive logic cells necessary to construct the primitive-based version of each standard cell in the standard cell library.

24. A method for creating a user-defined cell, comprising:
constructing a user-defined cell from primitive logic cells, the primitive logic cells being defined for integration onto a base array, and wherein each primitive logic cell is not a standard cell;
analyzing an electrical performance of the user-defined cell;
developing a cell-level layout of the user-defined cell to determine an area to be occupied by the user-defined cell when integrated onto the base array; and
storing a description of the constructed user-defined cell as computer readable code on a data storage device for storing data to be read by a computer system, the analyzed electrical performance of the user-defined cell, and the cell-level layout of the user-defined cell within a primitive-based cell library.

25. A method for creating a user-defined cell as recited in claim 24, further comprising:
verifying compliance of the analyzed electrical performance of the user-defined cell with user-specified electrical performance requirements; and
modifying the user-defined cell as necessary to comply with the user-specified electrical performance requirements.

26. A method for creating a primitive constructed version of a logic cell that is not considered a standard cell, wherein the primitive constructed version of the logic cell can be integrated onto a base array, comprising:
determining a logic function of the logic cell;
mapping the determined logic function of the logic cell into a set of primitive logic cells to create the primitive constructed version of the logic cell, wherein each primitive logic cell in the set of primitive logic cells is not a standard cell, wherein the set of primitive logic cells is defined based on device characteristics of the base array; and
storing the primitive constructed version of the logic cell as computer readable code within a cell library on a data storage device for storing data to be read by a computer system.

27. A method for creating a primitive constructed version of a logic cell that is not considered a standard cell, wherein the primitive constructed version of the logic cell can be integrated onto a base array as recited in claim 26, further comprising:
analyzing an electrical performance of the primitive constructed version of the logic cell;
modifying the primitive constructed version of the logic cell as necessary to comply with electrical performance goals for the logic cell; and
developing a cell-level layout of the primitive constructed version of the logic cell.

* * * * *